United States Patent
Earle

(10) Patent No.: US 9,224,446 B2
(45) Date of Patent: Dec. 29, 2015

(54) MULTI-PORT MEMORY CIRCUIT, ACCESSING METHOD AND COMPILER

(71) Applicant: TAIWAN SEMICONDUCTOR MANUFACTURING COMPANY, LTD., Hsinchu (TW)

(72) Inventor: Adrian Earle, Kanata Ontario (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 215 days.

(21) Appl. No.: 13/664,923

(22) Filed: Oct. 31, 2012

(65) Prior Publication Data

US 2014/0119148 A1    May 1, 2014

(51) Int. Cl.
G11C 8/00 (2006.01)
G11C 8/16 (2006.01)
G11C 8/18 (2006.01)

(52) U.S. Cl.
CPC ... G11C 8/16 (2013.01); G11C 8/18 (2013.01)

(58) Field of Classification Search
CPC .................................... G11C 8/16; G11C 8/18
USPC ................. 365/49.1, 154, 230.02, 230.05
See application file for complete search history.

(56) References Cited

U.S. PATENT DOCUMENTS

| | | | |
|---|---|---|---|
| 6,181,634 B1* | 1/2001 | Okita | 365/230.05 |
| 7,653,780 B2* | 1/2010 | Takahashi | 711/106 |
| 8,295,073 B2* | 10/2012 | Norman | 365/148 |

OTHER PUBLICATIONS

Ishii, Yuichiro et al., "A 28nm 360ps-Access-Time Two-Port SRAM with a Time-Sharing Scheme to Circumvent Read Disturbs", ISSCC 2012, Session 13, High-Performance Embedded SRAM, 13.4. pp. 236-238.

* cited by examiner

*Primary Examiner* — Tha-O H Bui
(74) *Attorney, Agent, or Firm* — Hauptman Ham, LLP

(57) ABSTRACT

A memory circuit includes first and second word lines, a plurality of memory cells and a timing controller. Each memory cell includes a first access port and a second access port. The first access port is coupled to the first word line and configured to be enabled by a first word line signal on the first word line. The second access port is coupled to the second word line and configured to be enabled by a second word line signal on the second word line. The timing controller is configured to receive a timing select signal and to control a time delay between the first word line signal and the second word line signal to be different in response to different first and second states of the timing select signal.

20 Claims, 8 Drawing Sheets

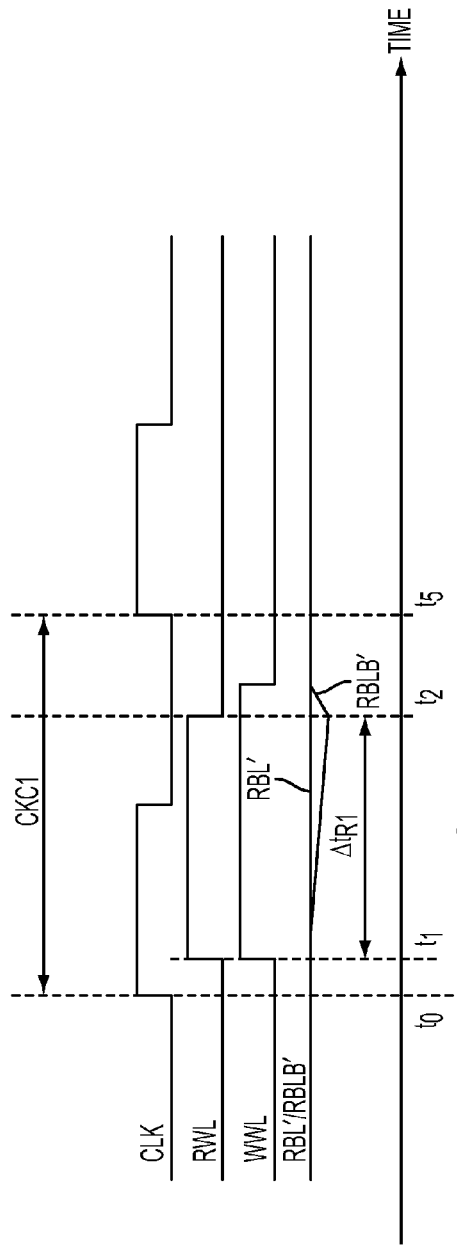
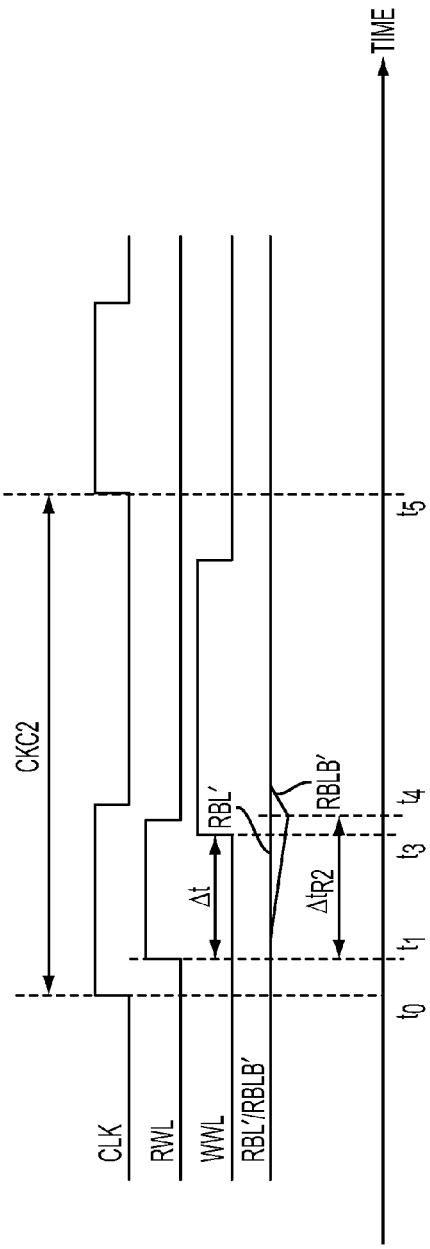

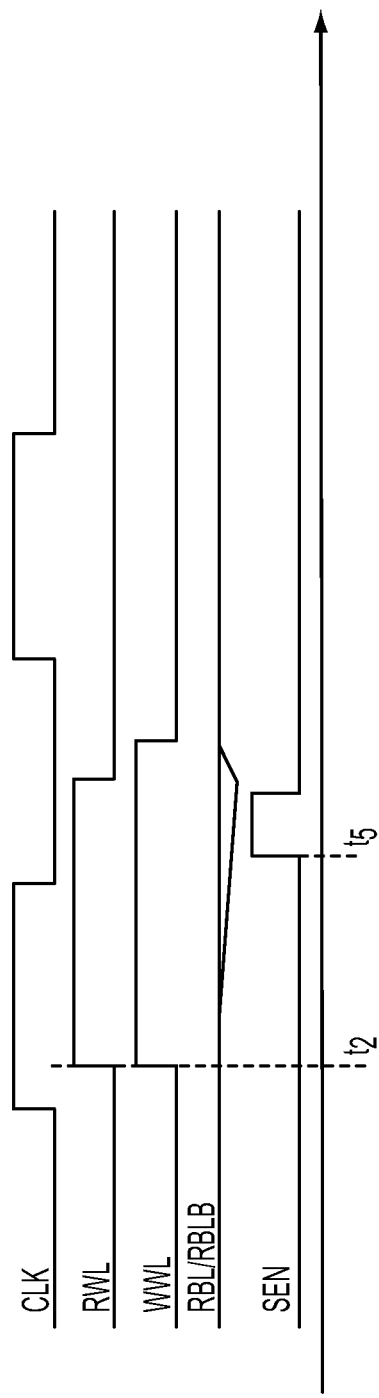
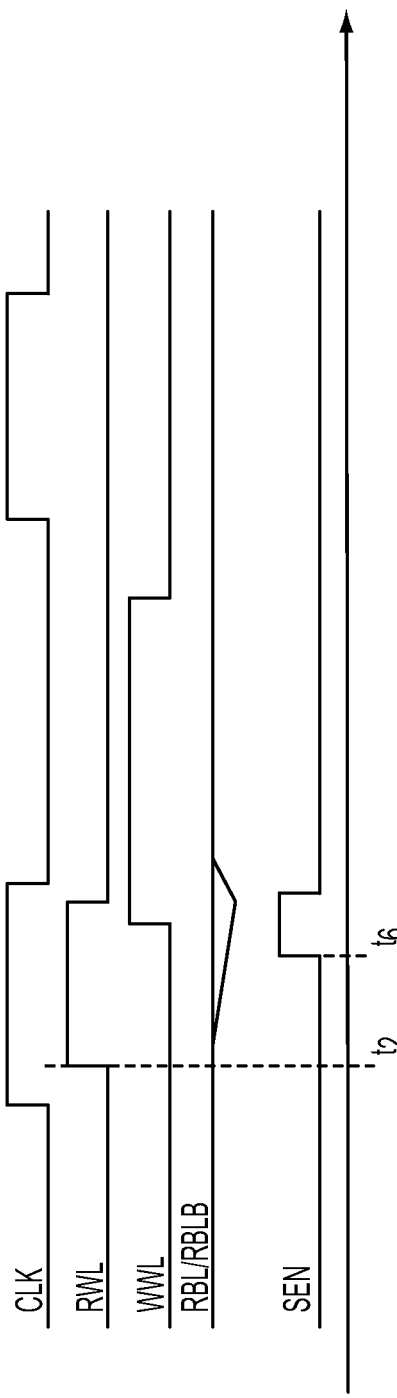

MULTI-PORT MEMORY CIRCUIT, ACCESSING METHOD AND COMPILER

BACKGROUND

Processors and memories are various parts of computing systems and electronic devices. The performance of a memory, such as capacity, access speed, power consumption etc. impacts the overall performance of the system or electronic device. Multi-port memories are developed to increase the data throughout, because multiple memory accesses are possible within a single clock cycle of a multiport memory.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 3A and 3B are timing diagrams of the operation of a memory circuit in different access modes in accordance with some embodiments.

FIGS. 5B and 5C are timing diagrams of the operation of a memory circuit in different access modes in accordance with some embodiments.

DETAILED DESCRIPTION

Figure 1:
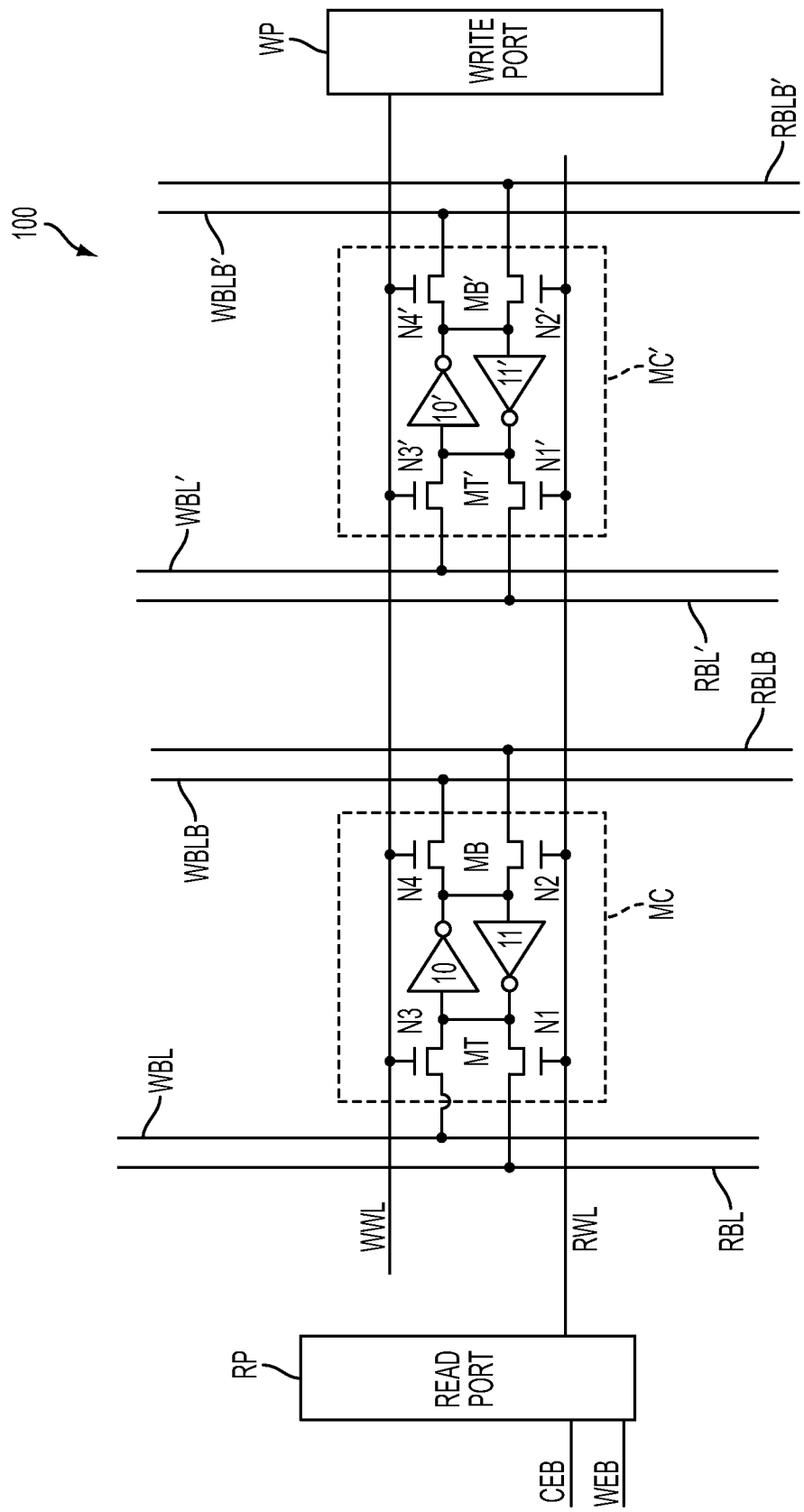
FIG. 1 is a schematic circuit diagram of a segment of a memory circuit in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details Like reference numerals in the drawings denote like elements.

Some embodiments describe a memory circuit having a plurality of memory cells each having a first access port and a second access port. The memory circuit further includes a timing controller for controlling a time delay between (i) a first access to the memory cells via the first access ports and (ii) a second access to the memory cells via the second access ports. The time delay is controlled to be greater in a first access mode than in a second access mode. Thus, the memory circuit provides flexibility in controlling how the memory cells are accessed, in order to achieve one or more effects. For example, in one or more embodiments, the first access mode with the greater time delay provides faster data output and/or lower peak power consumption, whereas the second access mode permits the memory circuit to run at a faster clock cycle. In one or more embodiments, an option to select which access mode the memory circuit is to be operated in is given in a memory compiler at the design phase.

FIG. 1 is a schematic circuit diagram of a segment of a memory circuit 100 in accordance with some embodiments. The memory circuit 100 comprises a first access port RP, a second access port WP, a first word line RWL coupled to the first access port RP, a second word line WWL coupled to the second access port WP, and a plurality of memory cells coupled to the first word line RWL and the second word line WWL. For simplicity, two memory cells, i.e., a first memory cell MC and a second memory cell MC', are illustrated in FIG. 1. Each of the access ports is either a read port or a write port. The word line coupled to a read port is a read word line, and the word line coupled to a write port is a write word line. For example, the first access port RP is a read port, the second access port WP is a write port, the first word line RWL is a read word line, and the second word line WWL is a write word line. Other multiport memory configurations with more than one read port and/or more than one write port are within the scope of various embodiments. In such multiport memory configurations, each memory cell is coupled to more than one read word line and/or more than one write word line.

The memory circuit 100 further includes a plurality of bit lines corresponding to the word lines and coupled to the memory cells. For example, a pair of first bit lines RBL/RBLB corresponding to the first word line RWL and a pair of second bit lines WBL/WBLB corresponding to the second word line WWL are coupled to the first memory cell MC. Bit lines corresponding to a read word line are read bit lines, and bit lines corresponding to a write word line are write bit lines. For example, the first bit lines RBL/RBLB corresponding to the first word line RWL, which is a read word line, are read bit lines, whereas the second bit lines WBL/WBLB corresponding to the second word line WWL, which is a write word line, are write bit lines. Similarly, a pair of read bit lines RBL'/RBLB' corresponding to the first word line RWL and a pair of write bit lines WBL'/WBLB' corresponding to the second word line WWL are coupled to the second memory cell MC'. Other multiport memory configurations, for example, with one bit line for each word line, are within the scope of various embodiments.

In some embodiments, each access port is enabled by a chip enable (or clock enable) signal CEB. For example, when the signal CEB inputted into the first access port RP is at a high logical level, a memory access via the first access port RP is not available. When the signal CEB inputted into the first access port RP is at a low logical level, a memory access via the first access port RP is available. A similar chip enable (or clock enable) signal is inputted to the second access port WP.

In some embodiments, each access port is selectively configurable as a read port or as a write port by a write enable signal WEB. For example, when the signal WEB inputted into the first access port RP is at a high level, the first access port RP is configured as a read port and a memory access via the first access port RP is a read access. When the signal WEB inputted into the first access port RP is at a low level, the first access port RP is configured as a write port and a memory access via the first access port RP is a write access. A similar write enable signal is inputted to the second access port WP.

Each access port includes circuitry configured to control memory access through the access port. For example, the first access port RP includes a first word line driver (described later with respect to FIG. 5A) coupled to the corresponding first word line RWL for enabling the first word line RWL during a memory access through the first access port RP. The first access port RP further includes circuitry configured to enable a sensing amplifier (described later with respect to FIG. 5A) coupled to the first bit lines RBL/RBLB when the memory access is a read access. The first access port RP further includes circuitry configured to enable a write driver (described later with respect to FIG. 5A) coupled to the first bit lines RBL/RBLB when the memory access is a write access. Thus, the first word line RWL and the first bit lines RBL/RBLB are a read word line and read bit lines when the first access port RP is configured as a read port, and are a write word line and write bit lines when the first access port RP is configured as a write port. The second access port WP is configured similarly to the first access port RP. A memory with two access ports at least one of which is selectively configurable as a read port or as a write port is referred to herein as a "dual-port memory."

In some embodiments, at least one of the first access port RP or the second access port WP is permanently configured as a read port or a write port. In such embodiments, the write enable signal WEB is omitted. For example, when the first access port RP is permanently configured as a read port, the circuitry for controlling a write driver is omitted from the first access port RP. In another example, when the second access port WP is permanently configured as a write port, the circuitry for controlling a sensing amplifier is omitted from the second access port WP. A memory with two access ports one of which is permanently configured as a read port whereas the other is permanently configured as a write port is referred to herein as a "two-port memory."

In one or more embodiments, at least one access port is selectively configurable as a read port or as a write port, whereas at least another access port is permanently configured as a read port or a write port. For example, the first access port RP is permanently configured as a read port, whereas the second access port WP is selectively configurable as another read port or as a write port. In operation, when the second access port WP is configurable as another read port, the memory cells are accessible via two read ports which provides a faster reading operation.

An example memory configuration will now be described for the first memory cell MC. The second memory cell MC' is configured similarly to the first memory cell MC. Other memory configurations are within the scope of various embodiments.

The first memory cell MC is a multiport Static Random Access Memory (SRAM) memory cell. The first memory cell MC includes a first inverter I0, a second inverter I1, and transistors N1, N2, N3, N4. An input terminal of the first inverter I0 is coupled to an output terminal of the second inverter I1 at a first storage node MT. An input terminal of the second inverter I1 is coupled to an output terminal of the first inverter I0 at a second storage node MB. The first inverter I0 and the second inverter I1 form a latch circuit that retains information at the first storage node MT and the second storage node MB. The information stored at the first storage node MT is complementary to the information stored at the second storage node MB. For example, when a logic "1" is stored at the first storage node MT, a logic "0" is stored at the second storage node MB, and vice versa.

Each transistor N1, N2, N3, N4 has a control terminal coupled to a corresponding word line, and first and second terminals coupled to a corresponding storage node and a corresponding bit line. For example, the transistor N1 has a gate coupled to the first word line RWL, and a source and a drain coupled to the first storage node MT and the first bit line RBL. The transistor N2 has a gate coupled to the first word line RWL, and a source and a drain coupled to the second storage node MB and the first bit line RBLB. The transistor N3 has a gate coupled to the second word line WWL, and a source and a drain coupled to the first storage node MT and the second bit line WBL. The transistor N4 has a gate coupled to the second word line WWL, and a source and a drain coupled to the second storage node MB and the second bit line WBLB. In one or more embodiments, the first inverter I0, the second inverter I1 and the transistors N1-N4 are Complementary Metal Oxide Semiconductor (CMOS) devices. Other technologies for forming the components of the memory cells and/or the memory circuit 100 are within the scope of various embodiments. The second memory cell MC' includes a first inverter I0', a second inverter I1', and transistors N1', N2', N3', N4' which are similar to first inverter I0, the second inverter I1, and the transistors N1, N2, N3, N4 of the first memory cell MC.

Each memory cell has a first access port and a second access port coupled to the corresponding word lines. The access port coupled to a read word line is a read port, and the access port coupled to a write word line is a write port. For example, in the first memory cell MC, the transistors N1-N2 define a first access port coupled to the first word line RWL, and the transistors N3-N4 define a second access port coupled to the second word line WWL. When the first access port RP of the memory circuit 100 is configured as a read port, the first word line RWL is a read word line, and the first access port of the memory cell MC is a read port. When the first access port RP of the memory circuit 100 is configured as a write port, the first word line RWL is a write word line, and the first access port of the memory cell MC is a write port. Similarly, the second access port of the memory cell MC is a write port or a read port depending on how the second access port WP of the memory circuit 100 is configured.

Each access port of the memory cell MC is enabled by a word line signal on the corresponding word line. For example, the first access port of the first memory cell MC is enabled by a first word line signal on the first word line RWL, which turns ON the transistors N1-N2. Similarly, the second access port of the first memory cell MC is enabled by a second word line signal on the second word line WWL, which turns ON the transistors N3-N4. When an access port is enabled, the memory cell is accessible via the corresponding word line and bit line. For example, when the first access port, which is a read port, is enabled, the first memory cell MC is accessible via the first word line RWL in a reading operation and data is read from the first memory cell MC via the first bit lines RBL/RBLB. When the second access port, which is a write port, is enabled, the first memory cell MC is accessible via the second word line WWL in a writing operation and data is written into the first memory cell MC from the second bit lines WBL/WBLB. Other memory cell configurations are within the scope of various embodiments. For example, in one or more embodiments, each memory cell has three or more access ports each of which is a write port or a read port and is associated with a corresponding word line and a corresponding bit line.

In a multiport memory, multiple memory accesses via different access ports are possible within a clock cycle. An access, or memory access, includes either reading from or writing to the memory cell. For example, while the first memory cell MC is being accessed via the first access port and the corresponding first word line RWL, the second memory cell MC', is accessible via a second access port and the corresponding second word line WWL. The timings when the first access is made via the first access port and the first word line RWL and when the second access is made via the second access port and the second word line WWL have various effects on operation of the memory cells.

Figure 2:
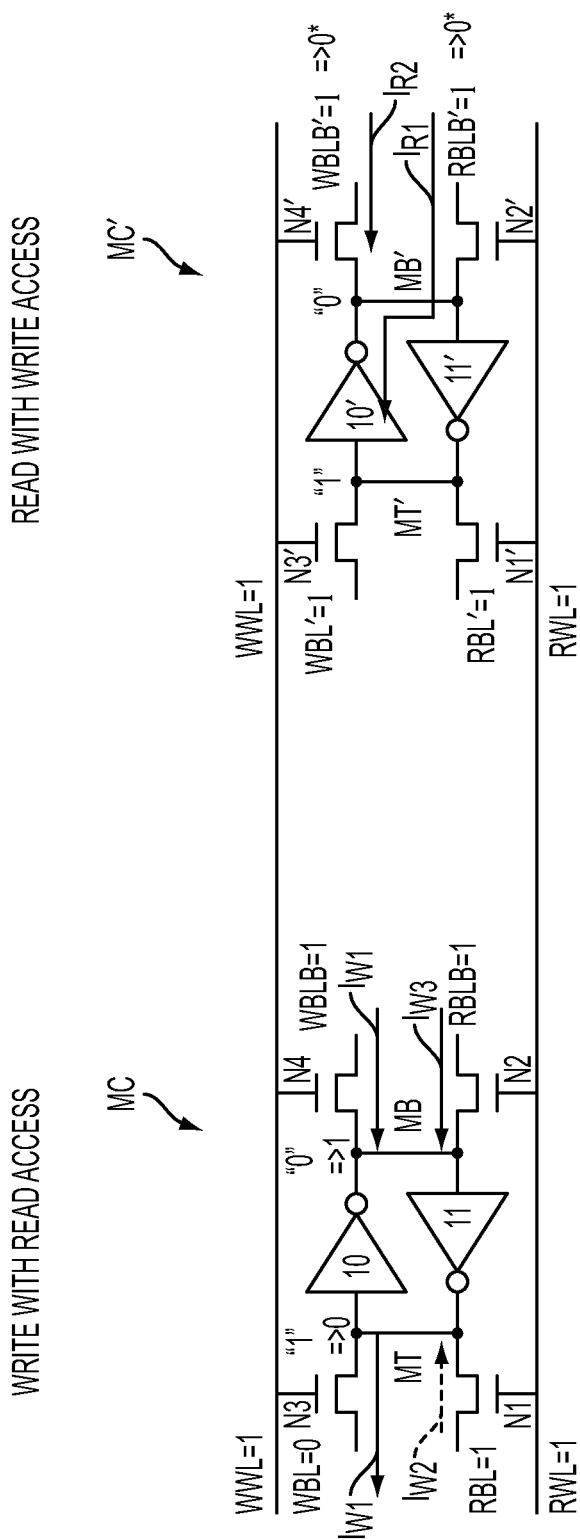
FIG. 2 is a schematic circuit diagram of a memory circuit in operation in accordance with some embodiments.

FIG. 2 is a schematic circuit diagram of the memory circuit 100 of FIG. 1 in operation where the first memory cell MC is accessed in a writing operation while the second memory cell MC' is accessed in a reading operation. For simplicity, a signal on a data line (or at a node) and the data line (or the node) itself are both referred to in this description by the same notation. For example, a first word line signal on the first word line RWL and the first word line RWL itself will both be referred to as "RWL."

The first memory cell MC has a write port defined by the transistors N3-N4. For enabling the write port of the first memory cell MC for a writing operation, a second word line signal WWL having a high level (WWL=1) is applied to the write port via the corresponding second word line WWL. The high-level second word line signal WWL is applied to the gates of the transistors N3-N4 and turns ON the transistors N3-N4. When the transistors N3-N4 are turned ON, a current path is established between the second bit lines WBL, WBLB and across the latch circuit defined by the first inverter I0 and second inverter I1. A current Iw1 flows from one of the second bit lines, i.e., WBLB which is at a high level (WBLB=1), via the latch circuit, to the other second bit line, i.e., WBL which is at a low level (WBL=0). As a result, the first storage node MT is pulled down from the logic "1" to the logic "0," and the second storage node MB is pulled up from the logic "0" to the logic "1."

During the above described writing operation in the first memory cell MC, the second memory cell MC' is accessed in a reading operation. The second memory cell MC' has a read port defined by the transistors N1'-N2' and coupled to the first word line RWL. For enabling the read port of the second memory cell MC' for a reading operation, a first word line signal RWL having a high level (RWL=1) is applied to the corresponding first word line RWL. This high-level first word line signal RWL enables not only the read port of the second memory cell MC', but also the read port of the first memory cell MC being written to, because the read port of the first memory cell MC is also coupled to the first word line RWL. In other words, the reading operation in the second memory cell MC' turns ON the transistors N1-N2 of the first memory cell MC. When the transistors N1-N2 are turned ON, current paths are established between the first bit lines RBL, RBLB and the corresponding first storage node MT and second storage node MB. More specifically, as the first storage node MT is pulled down due to the writing operation, a current Iw2 flows from one of the first bit lines, i.e., RBL which is pre-charged to a high level (RBL=1), to the first storage node MT. As the second storage node MB is pulled up due to the writing operation, a current Iw3 flows from the second bit line, i.e., RBLB which is pre-charged to a high level (RBLB=1), to the second storage node MB. The current Iw2 flows to the first storage node MT in the opposite direction to the current Iw1 and interferes with the writing of the logic "0" at the first storage node MT.

The situation described above with respect to the first memory cell MC is reversed in the second memory cell MC', i.e., the second memory cell MC' is accessed in a reading operation when the first memory cell MC is accessed in a writing operation. The second memory cell MC' has a read port defined by the transistors N1'-N2'. The high-level first word line signal RWL (RWL=1) is applied to the gates of the transistors N1'-N2' and turns ON the transistors N1'-N2'. When the transistors N1'-N2' are turned ON, a current path is established between one of the first bit lines RBL', RBLB' and the corresponding first storage node MT' or second storage node MB', depending on the data stored at the storage nodes of the second memory cell MC'. For example, when the data stored at the second storage node MB' is the logic "0," a current Ir1 flows from the first bit line RBLB', which is pre-charged to a high level (RBLB'=1), to the second storage node MB'. As a result, the voltage on the first bit line RBLB' is pulled down. When the voltage RBLB' is pulled down to a predetermined sensible level, the voltage RBLB' is sensed by a sensing amplifier (described later with respect to FIG. 5A) and the data stored in the second memory cell MC' is read out.

As discussed above, a second word line signal WWL having a high level (WWL=1) is applied to the corresponding second word line WWL to enable the write port of the first memory cell MC. The high-level second word line signal WWL (WWL=1) enables not only the write port of the first memory cell MC, but also the write port of the second memory cell MC' being read from, because the write port of the second memory cell MC' is also coupled to the second word line WWL. In other words, the writing operation in the first memory cell MC turns ON the transistors N3'-N4' of the second memory cell MC'. When the transistors N3'-N4' are turned ON, a current path is established between one of the second bit lines WBL', WBLB' and the corresponding first storage node MT' or second storage node MB', depending on the data stored at the storage nodes of the second memory cell MC'. For example, when the data stored at the second storage node MB' is the logic "0," a current Ir2 flows from the second bit line WBLB', which is at a high level (WBLB'=1), to the second storage node MB'. The additional current Ir2 tends to pull up the second storage node MB' and, therefore, slows down the pulling-down of the voltage RBLB'. Consequently, it takes longer for the voltage RBLB' to reach the sensible level, i.e., it takes longer for the reading operation in the second memory cell MC' to complete. In some situations, due to the additional current Ir2 that pulls up the second storage node MB', it is possible that the second storage node MB' is flipped, i.e., switched from the logic "0" to the logic "1," which distorts data accuracy. Such effects are referred to as "read disturb."

FIG. 3A is a timing diagram of the above-described operation of the memory circuit 100 in a first access mode in accordance with some embodiments. In FIG. 3A, CLK indicates a clock signal. The high-level first word line signal RWL (RWL=1) and the high-level second word line signal WWL (WWL=1) are applied to the corresponding first word line RWL and second word line WWL within a clock cycle CKC1. The clock cycle CKC1 is the interval between a rising edge (at time t0 and time t0') of two successive clock pulses of the clock signal CLK. In the first access mode of FIG. 3A, the high-level first word line signal RWL and the high-level second word line signal WWL are simultaneously applied (at time t1) to the corresponding first word line RWL and second word line WWL. In the reading operation of the second memory cell MC', the voltage RBLB' is pulled down, whereas the voltage RBL' remains at the high, pre-charged level. Due to the above described "read disturb" effect, the voltage RBLB' takes a time period ΔtR1 to reach the sensible level (at time t2) to complete the reading operation.

In some embodiments, the above described interfering effects that first and second accesses in a clock cycle possibly cause for each other are avoidable or reduced by introducing a time delay between the first and second accesses. FIG. 3B is a timing diagram of the operation of the memory circuit 100 in a second access mode in accordance with some embodiments where such a time delay is introduced. In the second access mode of FIG. 3B, the second access, e.g., writing to the first memory cell MC, is delayed to be performed after the first access, e.g., reading from the second memory cell MC'. In other words, a time delay Δt is introduced between a rising edge (at time t1) of the high-level first word line signal RWL (RWL=1) and a rising edge (at time t3) of the high-level second word line signal WWL (WWL=1). As a result, the write ports of the memory cells are enabled after the reading operation has proceeded for a time period corresponding to the time delay Δt. During the time period Δt, the pulling-down of the voltage RBLB' is not affected by the current Ir2, and the voltage RBLB' takes a shorter time period ΔtR2 to reach the sensible level (at time t4) to complete the reading operation. In at least one embodiment, the time delay is selected such that the voltage RBLB' has reached, or been sufficiently close to, the sensible level when the write ports are enabled.

In the first access mode of FIG. 3A, the first word line signal RWL and the second word line signal WWL are applied simultaneously (i.e., with a zero time delay) or with a non-zero time delay smaller than the time delay Δt of the second access mode. The clock cycle CKC2 in the second access mode is configured to accommodate the time delay Δt, and is longer than the clock cycle CKC1 in the first access mode. Thus, the first access mode permits the memory circuit 100 to run faster at a shorter clock cycle than the second access mode. In one or more embodiments, the first access mode is used for memory accesses where short clock cycle is a preference.

In contrast, the second access mode provides a faster reading operation, with a shorter time from clock to data output (tkq). The slower clock cycle in the second access mode further permits the memory circuit 100 to run at a lower voltage which, in turn, reduces power consumption of the memory circuit 100. The second access mode also reduces peak power in some embodiments. Peak power is the maximum instantaneous power demand of the memory circuit 100. When several circuits or devices are switched ON at the same time, or substantially the same time, the individual power demands of the circuits or devices are summed, resulting in a large instantaneous power demand peak. If such circuits or devices are switched ON at different times, then the instantaneous power demand is less. In the first access mode of FIG. 3A, the power demands for enabling (e.g., switching ON) the first and second word lines RWL and WWL are incurred at time t1, resulting in a large instantaneous power demand peak. In the access mode of FIG. 3B, the power demand for enabling the first word line RWL is incurred at time t1, but the power demand for enabling the second word line WWL is incurred at different time t3. Thus, the power demand is spread out in time, resulting in lower instantaneous power demand peaks than in the first access mode of FIG. 3A. In one or more embodiments, the second access mode is used for memory accesses where power consumption and/or high tkq is/are preferred over clock cycle.

Given that each access mode provides one or more specific effects and is suitable for certain applications and/or operating conditions, some embodiments provide a mechanism for controllably selecting the access modes in accordance with user and/or system preferences.

Figure 4:
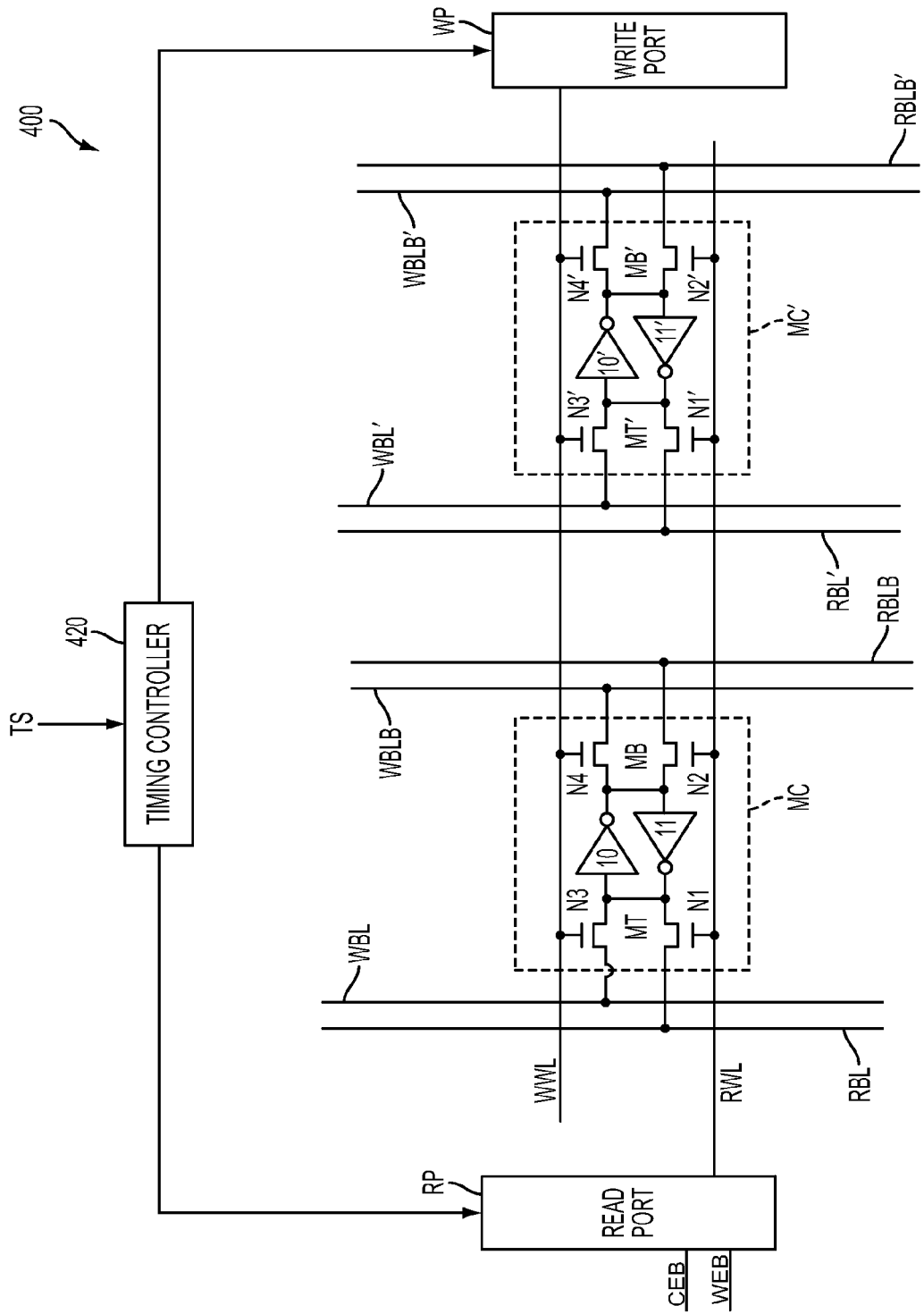
FIG. 4 is a schematic diagram of a memory circuit in accordance with some embodiments.

FIG. 4 is a schematic block diagram of a memory circuit 400 in accordance with some embodiments. The memory circuit 400 is similar to the memory circuit 100 described with respect to FIG. 1. The memory circuit 400 further includes a timing controller 420 which is configured to receive a timing select signal TS. The timing controller 420 is further coupled to the read port RP and the write port WP of the memory circuit 400 for controlling a time delay between the first word line signal RWL and the second word line signal WWL to be different in response to different first and second states of the timing select signal. For example, in response to a first state of the timing select signal TS, e.g., a low level, the time delay is controlled by the timing controller 420 to be small or zero. As a result, the memory circuit 400 operates in the first access mode as described with respect to FIG. 3A. In response to a second, different state of the timing select signal TS, e.g., a high level, the time delay is controlled by the timing controller 420 to be greater than in response to the first state of the timing select signal TS. As a result, the memory circuit 400 operates in the second access mode as described with respect to FIG. 3B. By changing the states of the timing select signal TS, it is possible to change the access mode of the memory circuit 400 depending on user and/or system preference.

In one or more embodiments, the timing controller 420 switches the operation of the memory circuit 400 between the first access mode and the second access mode. For example, for an application that prefers memory accesses at high speed, i.e., at short clock cycle, over power consumption, a user or a computer system that uses the memory circuit 400 sends the timing select signal TS having the first state to the timing controller 420. As a result, the timing controller 420 switches the memory circuit 400 to the first access mode for high speed I/O operation. For an application that prefers power consumption over speed, the user or the computer system sends the timing select signal TS having the second state to the timing controller 420 which switches the memory circuit 400 to the second access mode to save energy. The flexibility provided by the timing controller 420 and the timing select signal TS is useful in at least one embodiment for power management.

Although some specifically disclosed embodiments describe that the read port of each memory cell is accessed simultaneously with or before the write port of the memory cell is accessed, the present disclosure is not limited to such arrangements. In at least one embodiment, it is possible to access the write port of each memory cells before the read port of the memory cell, in any of the access modes of the memory circuit 400.

In at least one embodiment, both access ports RP, WP of the memory circuit 400 are configured as read ports, and as a result, both access ports of each memory cell are read ports. For example, when the memory circuit 400 is a dual-port memory as described with respect to FIG. 1, it is possible to configure both access ports RP, WP of the memory circuit 400 as read ports, e.g., by an appropriate write enable signals inputted to the access port(s) RP and/or WP. In such a two-read-port configuration, an example first access mode includes accessing all read ports of each memory cell simultaneously, and an example second access mode includes accessing the read ports of each memory cell sequentially. When the dual-port memory is configured to have one read port and one write port, the memory cells are accessed in different first and second access modes as described with respect to FIGS. 3A and 3B.

Although some specifically disclosed embodiments describe the memory cells as dual-port or two-port memory cells each with two access ports, the present disclosure is not limited to such arrangements. In at least one embodiment, each memory cell includes more than two access ports, for example, at least first and second read ports and at least one write port. For such a memory cell, an example first access mode includes accessing all read and write ports simultaneously, and an example second access mode includes accessing the read ports sequentially before accessing the write port(s). More specifically, in the example second access mode, the first read port of each memory cell is accessed first, then the second read port is accessed, and then the remaining write port(s) is/are accessed. Thus, the reading operation via the first read port is not affected by the reading operation via the second read port which, in turn, is not affected by the writing operation(s) via the write port(s).

In at least one embodiment, each memory cell includes at least one read port and at least first and second write ports. For such a memory cell, an example first access mode includes accessing all read and write ports simultaneously, and an example second access mode includes accessing the read port before accessing all write ports together. More specifically, in the example second access mode, the read port of each memory cell is accessed first, then the first and second write ports are accessed. In other words, the first and second write ports of each memory cell are accessed simultaneously in both the first and second access modes.

Although some specifically disclosed embodiments describe two access modes, the present disclosure is not limited to such arrangements. In at least one embodiment, it is possible for the timing controller 420 to control the memory circuit 400 to operate in more than two access modes corresponding to more than two states of the timing select signal TS which, for this purpose, includes at least two bits. As a result, the time delay between a first memory access via the first port and a second memory access via the second port during a clock cycle has three different time delay values (one of which is possibly zero). This configuration provides an additional level or levels for power management and/or other purposes. For a memory cell having at least three ports in accordance with some embodiments, more than two access modes are controllable by the timing controller 420 to vary the mutual time delays among memory accesses via the at least three ports.

Figure 5A:
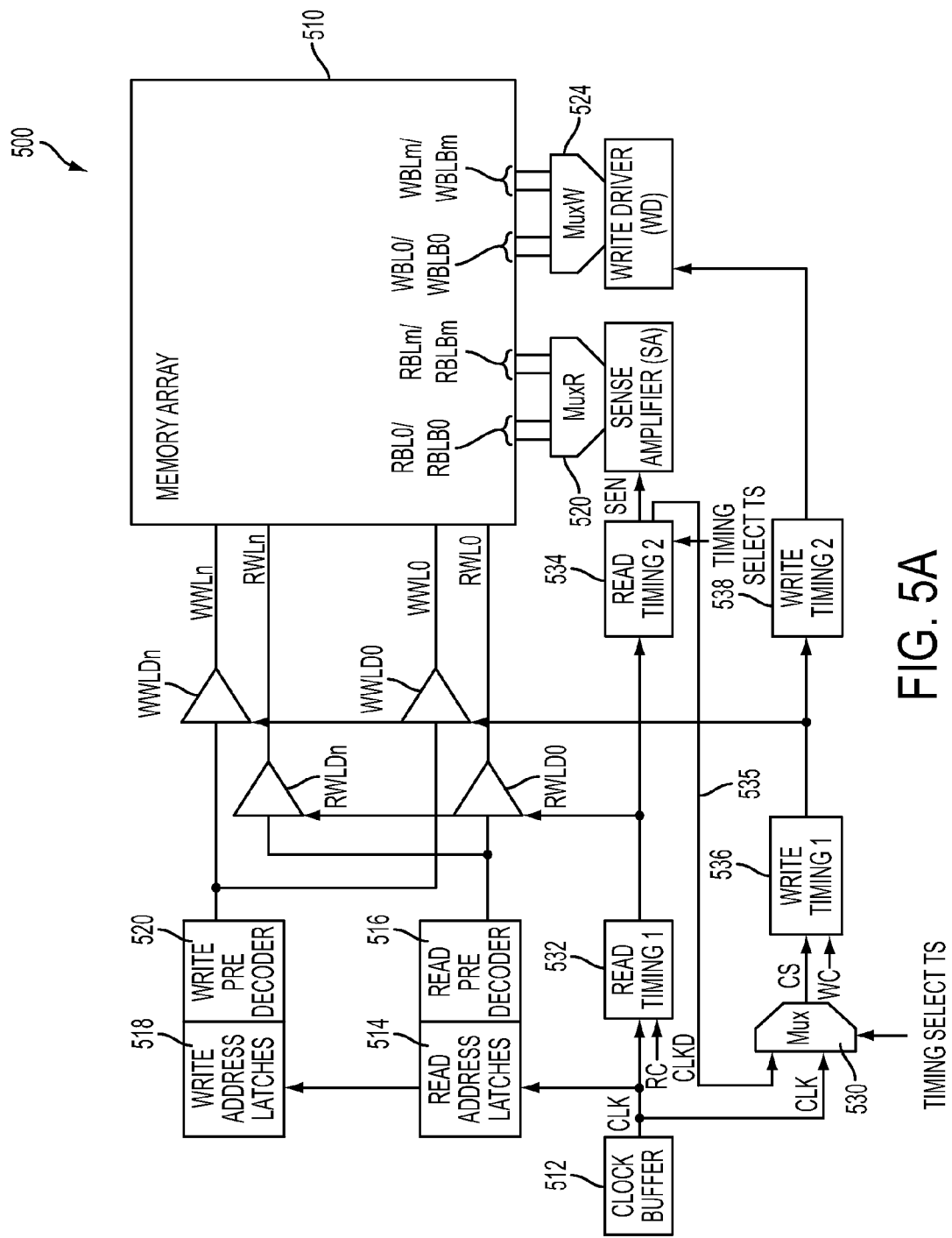
FIG. 5A is a schematic block diagram of a memory circuit in accordance with some embodiments.

FIG. 5A is a schematic block diagram of a memory circuit 500 in accordance with some embodiments. The memory circuit 500 is a two-port memory. However, the description below also applies to dual-port memories and memories having more than two access ports. The memory circuit 500 includes a memory array 510, a plurality of first word lines RWL0~RWLn which are read word lines, a plurality of second word line WWL0~WWLn which are write word lines, a plurality of pairs of first bit lines RBL0/RBLB0~RBLm/RBLBm which are read bit lines, and a plurality of pairs of second bit lines WBL0/WBLB0~WBLm/WBLBm which are write bit lines. The memory array 510 includes a plurality of multiport memory cells similar to the memory cell MC, MC' described with respect to FIG. 1. Each memory cell has a read port coupled to a corresponding read word line among RWL0~RWLn, and a write access port coupled to a corresponding write word line among WWL0~WWLn. Each memory cell is further coupled to a corresponding pair of read bit lines among RBL0/RBLB0~RBLm/RBLBm, and to a corresponding pair of write bit lines among WBL0/WBLB0~WBLm/WBLBm.

The memory circuit 500 further includes a clock buffer 512, read access latches 514, read pre-decoder 516, write access latches 518, write pre-decoder 520, a plurality of read word line drivers RWLD0~RWLDn, and a plurality of write word line drivers WWLD0~WWLDn. The read access latches 514, read pre-decoder 516, and read word line drivers RWLD0~RWLDn are parts of a read port similar to the read port RP described with respect to FIG. 1. The write access latches 518, write pre-decoder 520, and write word line drivers WWLD0~WWLDn are parts of a write port similar to the write port WP described with respect to FIG. 1. The read access latches 514 are coupled to the clock buffer 512 to receive a clock signal CLK. The read access latches 514 further receive and latch read addresses of the memory cells to be read from, and output the latched read addresses to the read pre-decoder 516. The read pre-decoder 516 pre-decodes the inputted read addresses and outputs the pre-decoded read addresses to the read word line drivers RWLD0~RWLDn. Each of the read word line drivers RWLD0~RWLDn is coupled to a corresponding read word line among RWL0~RWLn. The write access latches 518are coupled to the clock buffer 512 to receive the clock signal CLK. The write access latches 518 further receive and latch write addresses of the memory cells to be written to, and output the latched write addresses to the write pre-decoder 520. The write pre-decoder 520 pre-decodes the inputted write addresses and outputs the pre-decoded write addresses to the write word line drivers WWLD0~WWLDn. Each of the write word line drivers WWLD0~WWLDn is coupled to a corresponding write word line among WWL0~WWLn.

The memory circuit 500 further includes a sensing amplifier SA coupled to the read bit lines RBL0/RBLB0~RBLm/RBLBm via a read multiplexer MuxR, and a write driver WD coupled to the write bit lines WBL0/WBLB0~WBLm/WBLBm via a write multiplexer MuxW. The sensing amplifier SA senses the voltages on the read bit lines RBL0/RBLB0~RBLm/RBLBm to detect data stored in the memory cells corresponding to the read addresses inputted via the read port. The write driver WD drives the write bit lines WBL0/WBLB0~WBLm/WBLBm to store data inputted via the write driver WD to the memory cells corresponding to the write addresses inputted via the write port.

The memory circuit 500 further includes a timing select multiplexer (Mux) 530, a first read delay circuit (READ TIMING 1) 532, a second read delay circuit (READ TIMING 2) 534, a first write delay circuit (WRITE TIMING 1) 536 and a second write delay circuit (WRITE TIMING 2) 538. The timing select multiplexer 530 and the delay circuits 532, 534, and 536 define a timing controller similar to the timing controller 420 described with respect to FIG. 4. The first read delay circuit 532 is coupled to the clock buffer 512 to receive the clock signal CLK and outputs a delayed clock signal to the second read delay circuit 534. The delayed clock signal from the first read delay circuit 532 is also outputted to the read word line drivers RWLD0~RWLDn to enable the read word line drivers RWLD0~RWLDn to apply read word line signals to the corresponding read word lines RWL0~RWLn. A time delay caused by the first read delay circuit 532 is selected, in one or more embodiments, to provide sufficient time for the read address pre-decoding to complete. In at least one embodiment, the first read delay circuit 532 is omitted.

The second read delay circuit 534 is enabled by a read command RC. In the two-port memory configuration of the memory circuit 500, the read command RC corresponds to the clock enable signal CEB inputted to the first access port RP as described with respect to FIG. 1. In a dual-port memory configuration in accordance with some embodiments, the read command RC corresponds to a combination of the clock enable signal CEB and the write enable signal WEB inputted to the first access port RP as described with respect to FIG. 1. The second read delay circuit 534is coupled to receive the delayed clock signal from the first read delay circuit 532 and outputs a further delayed clock signal CLKD, via a feedback line 535, to a first input of the timing select multiplexer 530. A second input of the timing select multiplexer 530 is coupled to the clock buffer 512 to receive the clock signal CLK. The timing select multiplexer 530 further includes a control input for receiving the timing select signal TS. The timing select multiplexer 530 functions as a switch, in accordance with the timing select signal TS, to output either the clock signal CLK or the delayed clock signal CLKD as a control signal CS of the timing select multiplexer 530. Other switching arrangements are usable in lieu of or in addition to the timing select multiplexer 530, in accordance with some embodiments.

The first write delay circuit 536 is enabled by a write command WC. In the two-port memory configuration of the memory circuit 500, the write command WC corresponds to a clock enable signal inputted to the second access port WP as described with respect to FIG. 1. In a dual-port memory configuration in accordance with some embodiments, the write command WC corresponds to a combination of the clock enable signal and a write enable signal inputted to the second access port WP as described with respect to FIG. 1. The first write delay circuit 536 is coupled to the timing select multiplexer 530 to receive the control signal CS, and outputs a delayed control signal CS to the write word line drivers WWLD0~WWLDn to enable the write word line drivers WWLD0~WWLDn to apply write word line signals to the corresponding write word lines WWL0~WWLn. A time delay caused by the first write delay circuit 536 is selected, in one or more embodiments, to provide sufficient time for the write address pre-decoding to complete. In at least one embodiment, the first write delay circuit 536 is omitted.

The time delays caused by the first read delay circuit 532 and the first write delay circuit 536 are small. Thus, the clock signal CLK applied to the read word line drivers RWLD0~RWLDn starts a read access via the read word lines RWL0~RWLn, whereas the control signal CS applied to the write word line drivers WWLD0~WWLDn starts a write access via the write word lines WWL0~WWLn. When the timing select signal TS is at a low level corresponding to a first access mode, the timing select multiplexer 530 outputs the clock signal CLK as the control signal CS. As a result, both the read access and the write access are started by the clock signal CLK, i.e., the read access and the write access are simultaneously performed in the first access mode as described with respect to FIG. 3A. When the timing select signal TS is at a high level corresponding to a second access mode, the timing select multiplexer 530 outputs the delayed clock signal CLKD as the control signal CS. As a result the read access is started first by the clock signal CLK, and the write access is started after a time delay by the delayed clock signal CLKD in the second access mode as described with respect to FIG. 3B. The time delay caused by the second read delay circuit 534 defines the time delay between the read access and the write access in the second access mode.

In some embodiments, the second read delay circuit 534 outputs a sensing amplifier enable signal SEN to the sensing amplifier SA. A purpose of the sensing amplifier enable signal SEN is to enable the sensing amplifier SA when the voltages on the read bit lines RBL0/RBLB0~RBLm/RBLBm have sufficiently developed (e.g., pulled down) to reach the vicinity of the sensible level. This configuration prevents the sensing amplifier SA from being enabled too early, because, under certain circumstances, if the sensing amplifier SA is enabled too early, there is a possibility that a wrong value is read out from the accessed memory cell. In at least one embodiment, the second read delay circuit 534 also receives the timing select signal TS, and outputs the sensing amplifier enable signal SEN in accordance with a state of the timing select signal TS. For example, when the timing select signal TS is at a low level corresponding to the first access mode in which the read access and the write access are performed simultaneously, it takes longer for the voltages on the read bit lines RBL0/RBLB0~RBLm/RBLBm to reach the sensible level of the sensing amplifier SA. Thus, in the first access mode, the second read delay circuit 534 outputs the sensing amplifier enable signal SEN at a relatively late time t5 after the start of the read access at t1, as illustrated in FIG. 5B which is a timing diagram similar to FIG. 3A except for the addition of the sensing amplifier enable signal SEN.

When the timing select signal TS is at a high level corresponding to the second access mode in which the read access and the write access are performed with a time delay in between, it takes shorter for the voltages on the read bit lines RBL0/RBLB0~RBLm/RBLBm to reach the sensible level of the sensing amplifier SA. Thus, in the second access mode, the second read delay circuit 534 outputs the sensing amplifier enable signal SEN at a relatively early time t6 after the start of the read access at t1, as illustrated in FIG. 5C which is a timing diagram similar to FIG. 3B except for the addition of the sensing amplifier enable signal SEN. In other words, the sensing amplifier enable signal SEN is outputted by the second read delay circuit 534 in response to the second state (e.g., a high level) of the timing select signal TS earlier than in response to the first state (e.g., a low level) of the timing select signal.

Similar to the second read delay circuit 534, the second write delay circuit 538 is provided in one or more embodiments to enable the write driver WD after a predetermined time delay from the start of the write access, thereby saving energy by preventing the write driver WD from being enabled too early. In at least one embodiment, the second write delay circuit 538 is omitted.

The timing controller configuration described with respect to FIG. 5A is an example, and does not serve to limit the scope of the instant disclosure. Other arrangements are within the scope of various embodiments. For example, in at least one embodiment, the timing select multiplexer 530 and the feedback line 535 from the second read delay circuit 534 are omitted. The clock signal CLK and the timing select signal TS are inputted to the first write delay circuit 536. The first write delay circuit 536 is configured output the clock signal CLK in response to the first state of the timing select signal TS, and to output a delayed clock signal in response to the second state of the timing select signal TS. The time delay caused by the first write delay circuit 536 in the delayed clock signal corresponds to the time delay between the read access and the write access in the second access mode.

Although some specifically disclosed embodiments describe a mechanism for permitting a user or a computer system that uses the memory circuit to select an appropriate access mode during operation of the memory circuit, the present disclosure is not limited to such arrangements. In some embodiments, a selection of an access mode from a number of access modes is provided at the memory circuit design stage. In at least one embodiment such a selection is incorporated in a memory compiler. A memory compiler is configured to generate one or more memory configurations based on user-provided variables, perform simulations to evaluate the generated memory configurations, and create a physical layout of the complied memory based on the simulation results and/or various design rules.

Figure 6:
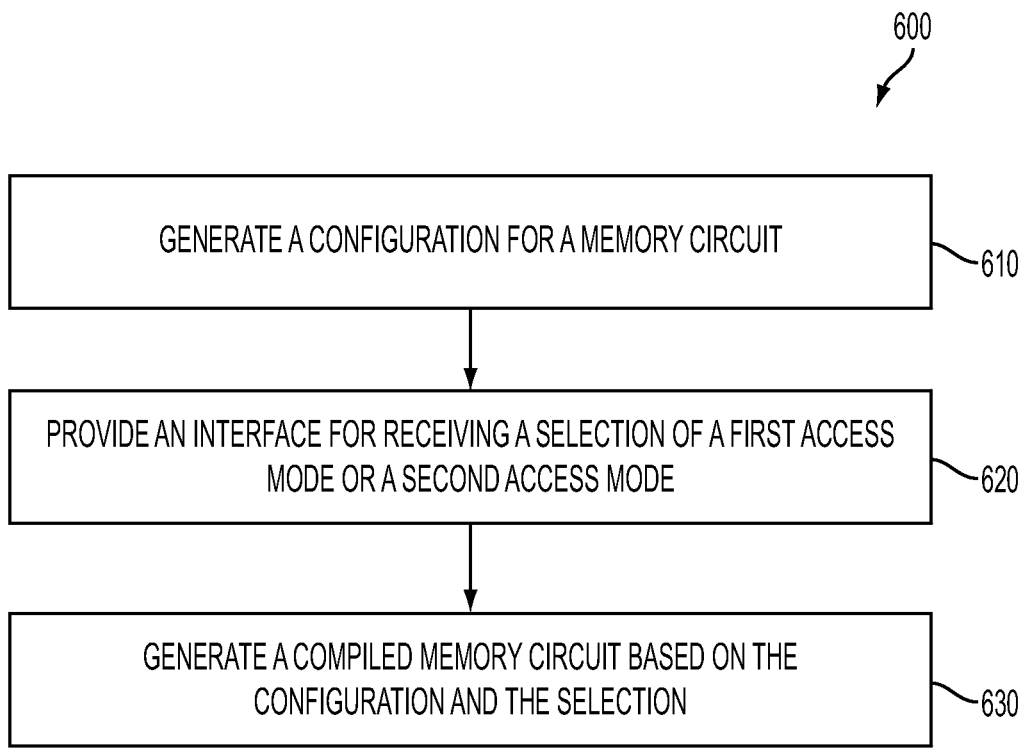
FIG. 6 is a flow chart showing an algorithm of a memory compiler in accordance with some embodiments.

FIG. 6 is a flow chart showing an algorithm 600 of a memory compiler in accordance with some embodiments.

At operation 610, the memory compiler generates a configuration for a memory circuit. In one or more embodiments, the configuration defines a memory circuit similar to the memory circuit 400 described with respect to FIG. 4.

At operation 620, the memory compiler provides an interface for receiving a selection of a first access mode or a second access mode. In at least one embodiment, the selection is made by a user and inputted into the memory compiler through the interface.

At operation 630, the memory circuit generates a compiled memory circuit based on the configuration generated at operation 610 and the selection received at operation 620. In one or more embodiments, when the selection received at operation 620 indicates that the memory circuit is to be operated in the first access mode as described, for example, with respect to FIG. 3A, the memory compiler configures the complied memory circuit to access the read port and the write port of each memory cell simultaneously. In at least one embodiment, the complied memory circuit configured to operate in the first access mode is similar to the memory circuit 500 in FIG. 5A, except that the timing select multiplexer 530, the feedback line 535 and the timing select signal TS are omitted. The clock signal CLK is inputted to the first write delay circuit 536. The time delay caused by the first write delay circuit 536 is negligible and is for ensuring that the write address pre-coding is completed.

In one or more embodiments, when the selection received at operation 620 indicates that the memory circuit is to be operated in the second access mode as described, for example, with respect to FIG. 3B, the memory compiler configures the complied memory circuit to access the read port and the write port of each memory cell sequentially. In at least one embodiment, the complied memory circuit configured to operate in the second access mode is similar to the memory circuit 500 in FIG. 5A, except that the timing select multiplexer 530, the feedback line 535 and the timing select signal TS are omitted. The clock signal CLK is inputted to the first write delay circuit 536. The time delay caused by the first write delay circuit 536 corresponds to the time delay between the read access and the write access in the second access mode.

Figure 7:
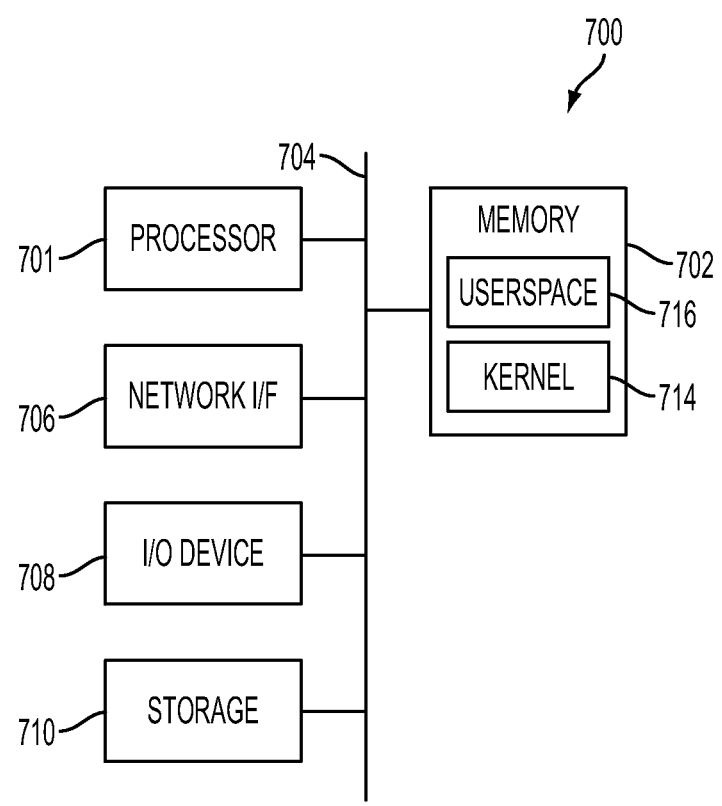
FIG. 7 is a block diagram of a computer system in accordance with some embodiments.

FIG. 7 is a block diagram of a computer system 700 in accordance with some embodiments. The memory compiler described with respect to FIG. 6 is realized in some embodiments by one or more computer systems 700 of FIG. 7. The system 700 comprises at least one processor 701, a memory 702, a network interface (I/F) 706, a storage 710, an input/output (I/O) device 708 communicatively coupled via a bus 704 or other interconnection communication mechanism.

The memory 702 comprises, in some embodiments, a random access memory (RAM) and/or other dynamic storage device and/or read only memory (ROM) and/or other static storage device, coupled to the bus 704 for storing data and/or instructions to be executed by the processor 701, e.g., kernel 714, user space 716, portions of the kernel and/or the user space, and components thereof. The memory 702 is also used, in some embodiments, for storing temporary variables or other intermediate information during execution of instructions to be executed by the processor 701.

In some embodiments, a storage device 710, such as a magnetic disk or optical disk, is coupled to the bus 704 for storing data and/or instructions, e.g., kernel 714, user space 716, etc. The I/O device 708 comprises an input device, an output device and/or a combined input/output device for enabling user interaction with the system 700. An input device comprises, for example, a keyboard, keypad, mouse, trackball, track pad, and/or cursor direction keys for communicating information and commands to the processor 701. An output device comprises, for example, a display, a printer, a voice synthesizer, etc. for communicating information to a user.

In some embodiments, one or more operations and/or functionality of the memory compiler described with respect to FIG. 6 are realized by the processor 701, which is programmed for performing such operations and/or functionality. One or more of the memory 702, the I/F 706, the storage 710, the I/O device 708, the hardware components 718, and the bus 704 is/are operable to receive instructions, data, design rules, netlists, layouts, models and/or other parameters for processing by the processor 701.

In some embodiments, one or more of the operations and/ or functionality of the memory compiler described with respect to FIG. 6 is/are implemented by specifically configured hardware (e.g., by one or more application specific integrated circuits (ASICs) which is/are included) separate from or in lieu of the processor 701. Some embodiments incorporate more than one of the described operations and/or functionality in a single ASIC.

In some embodiments, the operations and/or functionality are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The above method(s) include(s) example operations, which are not necessarily required to be performed in the order shown and/or described. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a memory circuit comprises first and second word lines, a plurality of memory cells and a timing controller. Each memory cell includes a first access port and a second access port. The first access port is coupled to the first word line and configured to be enabled by a first word line signal on the first word line. The second access port is coupled to the second word line and configured to be enabled by a second word line signal on the second word line. The timing controller is configured to receive a timing select signal and to control a time delay between the first word line signal and the second word line signal to be different in response to different first and second states of the timing select signal.

According to some embodiments, a method is provided for accessing a memory circuit comprising a first word line, a second word line, and a plurality of memory cells. Each memory cell includes a first access port and a second access port. The first access port is coupled to the first word line. The second access port is coupled to the second word line. The method comprises first accessing the memory cells via the first word line and the corresponding first access ports, and second accessing the memory cells via the second word line and the corresponding second access ports. In the method, a time delay between the first accessing and the second accessing is controlled in accordance with a first access mode or a second access mode. The time delay is greater in the second access mode than in the first access mode.

According to some embodiments, a memory compiler comprising a processor is provided. The processor generates a configuration for a memory circuit comprising a first word line, a second word line, a plurality of memory cells, and a timing controller. Each memory cell includes a first access port and a second access port. The first access port is coupled to the first word line, and the second access port is coupled to the second word line. The timing controller is configured to control a time delay between (i) a first access to the memory cells via the first word line and the corresponding first access ports, and (ii) a second access to the memory cells via the second word line and the corresponding second access ports.

The processor provides an interface for receiving a selection of a first access mode or a second access mode. The time delay between the first access and the second access is greater in the second access mode than in the first access mode. The processor generates a compiled memory circuit based on the configuration and the selection. The timing controller in the compiled memory circuit is configured to control the time delay between the first access and the second access in accordance with the selection.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory circuit, comprising:
a first word line configured to receive a first word line signal;
a second word line configured to receive a second word line signal;
a plurality of memory cells, each memory cell including a first access port and a second access port, the first access port coupled to the first word line and configured to be enabled by the first word line signal, the second access port coupled to the second word line and configured to be enabled by the second word line signal; and
a timing controller configured to receive a timing select signal and to control a time delay between the first word line signal and the second word line signal to be different in response to different first and second states of the timing select signal, the first state of the timing select signal corresponding to accessing one of the first access ports of the plurality of memory cells and one of the second access ports of the plurality of memory cells in a simultaneous manner within a clock cycle, and the second state of the timing select signal corresponding to accessing one of the first access ports of the plurality of memory cells and one of the second access ports of the plurality of memory cells in a sequential manner within the clock cycle;
wherein the timing controller comprises:
a delay circuit configured to generate a delayed signal; and
a switch coupled to the delay circuit and configured to switch an output of the timing controller between a first output signal independent of the delayed signal, and a second output signal including the delayed signal, the first output signal is independent of the timing select signal.

2. The memory circuit of claim 1, wherein:
the first access port is a read port, and
the second access port is a write port.

3. The memory circuit of claim 1, wherein:
the first access port is a read port, and
the second access port is another read port.

4. The memory circuit of claim 1, wherein:
the first access port is a read port, and
the timing controller is configured to delay the second word line signal relative to the first word line signal in response to the second state of the timing select signal more than in response to the first state of the timing select signal.

5. The memory circuit of claim 1, wherein the timing controller is configured to delay the second word line signal relative to the first word line signal in response to the second state of the timing select signal, without delaying the second word line signal relative to the first word line signal in response to the first state of the timing select signal.

6. The memory circuit of claim 1, wherein the switch comprises:
a multiplexer having
a first input configured to receive a clock signal corresponding to the first word line signal,
a second input coupled to the delay circuit to receive the delayed signal,
a control input configured to receive the timing select signal, and
an output configured to output an output signal corresponding to the second word line signal, the output signal including the clock signal received at the first input in response to the first state of the timing select signal, and the output signal including the delayed signal received at the second input in response to the second state of the timing select signal, the delayed signal corresponding to a delayed clock signal.

7. The memory circuit of claim 6, further comprising:
a plurality of read bit lines coupled to the corresponding memory cells; and
a sense amplifier coupled to the read bit lines and configured to sense voltages on the read bit lines in a reading operation,
wherein the delay circuit is further configured to output a sensing amplifier enable signal to the sensing amplifier.

8. The memory circuit of claim 7, wherein the delay circuit is further configured to receive the timing select signal and to output the sensing amplifier enable signal in response to the second state of the timing select signal earlier than in response to the first state of the timing select signal.

9. The memory circuit of claim 1, further comprising:
a plurality of read bit lines coupled to the corresponding memory cells;
a sense amplifier coupled to the read bit lines and configured to sense voltages on the read bit lines in a reading operation; and
the delay circuit configured to receive a clock signal corresponding to the first word line signal, and to output a sensing amplifier enable signal to the sensing amplifier,
wherein the delay circuit is further configured to receive the timing select signal and to output the sensing amplifier enable signal in response to the second state of the timing select signal earlier than in response to the first state of the timing select signal.

10. The memory circuit of claim 1, wherein the delay circuit is configured to receive a clock signal and the timing select signal, the first output signal corresponding to the clock signal, and the delayed signal corresponding to a delayed clock signal.

11. A method of accessing a memory circuit,
the memory circuit comprising:
a first word line;
a second word line; and
a plurality of memory cells, each memory cell including a first access port and a second access port, the first access port coupled to the first word line, the second access port coupled to the second word line;
the method comprising:
first accessing the memory cells via the first word line and the corresponding first access ports;
second accessing the memory cells via the second word line and the corresponding second access ports; and switching between a first output signal corresponding to a first access mode and a second output signal corresponding to a second access mode to control a time delay between the first accessing and the second accessing, the first output signal being independent of a delayed signal, the second output signal including the delayed signal, the first output signal being independent of a timing select signal;

wherein
- the time delay is greater in the second access mode than in the first access mode;
- the first access mode corresponds to performing the first accessing and the second accessing in a simultaneous manner within a clock cycle; and
- the second access mode corresponds to performing the first accessing and the second accessing in a sequential manner within the clock cycle.

12. The method of claim 11, wherein
the first access port of each memory cell is a read port,
the memory circuit further comprises:
- a plurality of read bit lines coupled to the corresponding memory cells; and
- a sense amplifier coupled to the read bit lines, and the method further comprises:
- enabling the sensing amplifier after a delay from a start of the first accessing, wherein the delay is shorter in the second access mode than in the first access mode.

13. The method of claim 11, wherein, in the first access mode, the time delay between the first accessing and the second accessing is zero.

14. The method of claim 13, wherein
each memory cell has at least two read ports, and
in the second access mode, the read ports of each memory cell are accessed sequentially.

15. The method of claim 13, wherein
each memory cell has at least two write ports, and
in both the first and second access modes, the write ports of each memory cell are accessed simultaneously.

16. The method of claim 11, wherein
each memory cell has more than two access ports each being a read port or a write port,
in the second access mode, the read ports of the memory cells are accessed before the write ports, and
in the first access mode, the read ports and write ports of the memory cells are accessed simultaneously.

17. A memory compiler, comprising a processor configured to:
generate a configuration for a memory circuit comprising
- a first word line,
- a second word line,
- a plurality of memory cells, each memory cell including a first access port and a second access port, the first access port coupled to the first word line, the second access port coupled to the second word line, and
- a timing controller configured to control a time delay between
  - a first access to the memory cells via the first word line and the corresponding first access ports, and
  - a second access to the memory cells via the second word line and the corresponding second access ports;

provide an interface for switching between a first output signal corresponding to a first access mode and a second output signal corresponding to a second access mode,
wherein
- the time delay between the first access and the second access is greater in the second access mode than in the first access mode;
- the first access mode corresponds to performing the first access and the second access in a simultaneous manner within a clock cycle;
- the second access mode corresponds to performing the first access and the second access in a sequential manner within the clock cycle;
- the first output signal is independent of a delayed signal, the first output signal is independent of a timing select signal; and
- the second output signal includes the delayed signal; and generate a compiled memory circuit based on the configuration and the switching, wherein the timing controller in the compiled memory circuit is configured to control the time delay between the first access and the second access in accordance with the selection.

18. The memory compiler of claim 17, wherein, in the first access mode, the time delay between the first access and the second access is zero.

19. The memory compiler of claim 17, wherein the interface is a multiplexer.

20. The memory compiler of claim 17, wherein:
the first access port is a read port, and
the second access port is a write port or another read port.

* * * * *